(12) United States Patent
Troia et al.

(10) Patent No.: US 11,309,049 B2
(45) Date of Patent: Apr. 19, 2022

(54) DIRECT MEMORY ACCESS USING JTAG CELL ADDRESSING

(71) Applicant: Micron Technology, Inc., Boise, ID (US)

(72) Inventors: Alberto Troia, Munich (DE); Antonino Mondello, Messina (IT)

(73) Assignee: Micron Technology, Inc., Boise, ID (US)

( * ) Notice: Subject to any disclaimer, the term of this patent is extended or adjusted under 35 U.S.C. 154(b) by 195 days.

(21) Appl. No.: 16/624,665

(22) PCT Filed: May 31, 2019

(86) PCT No.: PCT/IB2019/000466
§ 371 (c)(1),
(2) Date: Dec. 19, 2019

(87) PCT Pub. No.: WO2020/240228
PCT Pub. Date: Dec. 3, 2020

(65) Prior Publication Data
US 2021/0335438 A1    Oct. 28, 2021

(51) Int. Cl.
G11C 16/06    (2006.01)
G11C 29/32    (2006.01)
G11C 7/06    (2006.01)
G11C 7/10    (2006.01)
G11C 29/42    (2006.01)
H03K 19/173    (2006.01)

(52) U.S. Cl.
CPC .............. *G11C 29/32* (2013.01); *G11C 7/065* (2013.01); *G11C 7/106* (2013.01); *G11C 7/1087* (2013.01); *G11C 29/42* (2013.01); *H03K 19/1737* (2013.01); *G11C 2029/3202* (2013.01)

(58) Field of Classification Search
CPC ...................................................... G11C 16/06
USPC ........................................................ 365/201
See application file for complete search history.

(56) References Cited

U.S. PATENT DOCUMENTS

| | | | |
|---|---|---|---|
| 6,102,963 A * | 8/2000 | Agrawal | H03K 19/17704 365/185.33 |
| 6,442,092 B1 | 8/2002 | Tomita | |
| 6,535,963 B1 * | 3/2003 | Rivers | H04L 45/16 365/189.15 |

(Continued)

OTHER PUBLICATIONS

International Search Report and Written Opinion for related PCT Application No. PCT/IB2019/000466, dated Feb. 24, 2020, 14 pages.

*Primary Examiner* — Min Huang
(74) *Attorney, Agent, or Firm* — Brooks, Cameron & Huebsch, PLLC

(57) ABSTRACT

The present disclosure relates to a Flash memory component having a structurally independent structure and coupled to a System-on-Chip through a plurality of interconnection pads, comprising:
a memory array including a plurality of independently addressable sub arrays;
sense amplifiers coupled to corresponding outputs of said sub arrays and coupled to a communication channel of said System-on-Chip;
a scan-chain comprising modified JTAG cells coupled in parallel between the output of the sense amplifiers and said communication channel to allow performing read operations in a Direct Memory Access.
A method for retrieving data from the memory component is also disclosed.

18 Claims, 8 Drawing Sheets

(56) References Cited

U.S. PATENT DOCUMENTS

| | | | |
|---|---|---|---|
| 6,937,493 B2* | 8/2005 | Krause | G11C 16/102 |
| | | | 365/189.02 |
| 6,961,884 B1 | 11/2005 | Draper | |
| 2012/0117301 A1* | 5/2012 | Wingard | G06F 12/1027 |
| | | | 711/6 |
| 2019/0189221 A1* | 6/2019 | Kim | G11C 16/26 |

* cited by examiner

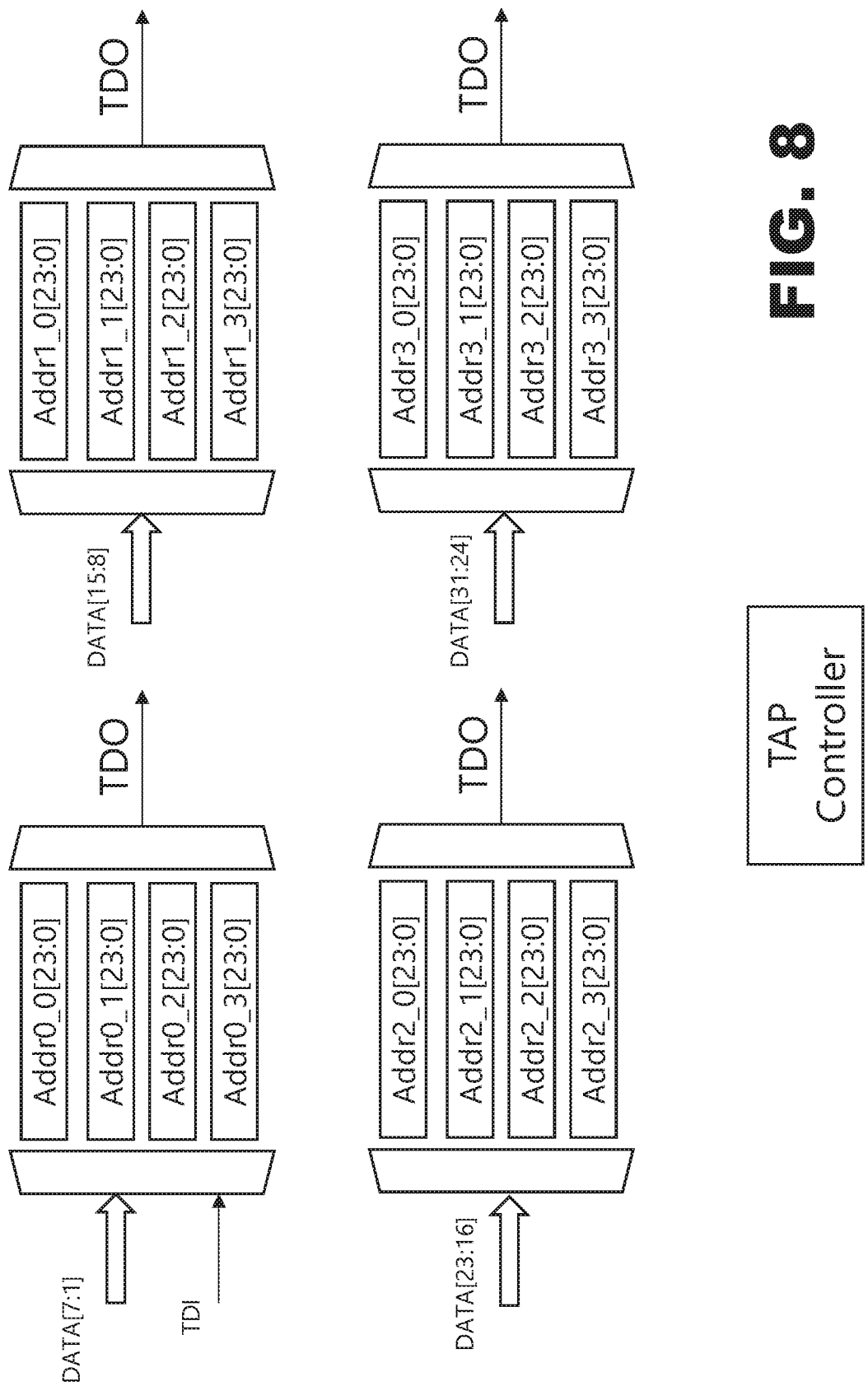

DIRECT MEMORY ACCESS USING JTAG CELL ADDRESSING

PRIORITY INFORMATION

This application is a National Stage Application under 35 U.S.C. § 371 of International Application Number PCT/IB2019/000466, filed on May 31, 2019, the contents of which are incorporated herein by reference.

The present disclosure relates generally to memory devices, and more particularly, to apparatuses and methods for non-volatile memory management. More specifically, the present disclosure relates in general to a method of optimizing direct memory access systems, and more particularly, to direct memory access using JTAG cell addressing.

BACKGROUND

Non-volatile memory can provide persistent data by retaining stored data when not powered and can include different topology of memory components. For instance, NAND flash memories and NOR flash memories may be considered equivalent circuits in terms of cells interconnections and reading structure, even if their performances are different.

A memory circuit having a NAND or NOR configuration may be realized adopting different technologies, for instance: floating gate (FG), charge-trapping (CT), phase change random access memory (PCRAM), self-selecting chalcogenide-based memories, resistive random access memory (RRAM), 3D XPoint memory (3DXP) and magnetoresistive random access memory (MRAM), among others.

Non-volatile Flash memories are today one of the fundamental building blocks in modern electronic systems, particularly for Real Time Operating Systems (RTOS), since they store code, firmware, O.S., applications and other software. The operation of non-volatile Flash memories is managed by an internal controller including an embedded firmware, such controller performing the required write/read/erase operations by manipulating the voltages and timing on the access and data lines.

The performances of Flash memories in terms of speed, consumption, alterability, nonvolatility and the increasing importance of system reconfigurability have pushed for their integration in System-on-Chip (SoC) devices. However, there are several non-volatile technologies used in SoC but the programming methodologies are requiring more space and the software is complicated in comparison to the past to full fill new regulations. This drawback is pushing toward the search of having more storage space with difficulties in integrating such a storage space in a SoC.

Moreover, embedded memory in System on Chips is more and more difficult to be managed when the lithography node is below 28 nm.

Therefore, there is a need for providing a new interface architecture that can be easily integrated in a SoC and improves the performances of the non-volatile memory portion while having a low initial latency in the first access and improving the overall throughput.

The present disclosure proposes a solution for improving the managing a flash memory component to be associated to a SoC device enhancing the yield reliability and performance of the memory while reducing and the cost and the power consumption.

BRIEF DESCRIPTION OF THE DRAWINGS

FIG. 8 is a schematic view of a group of address registers for a memory word in the memory portion of the present disclosure.

DETAILED DESCRIPTION

Figure 1:
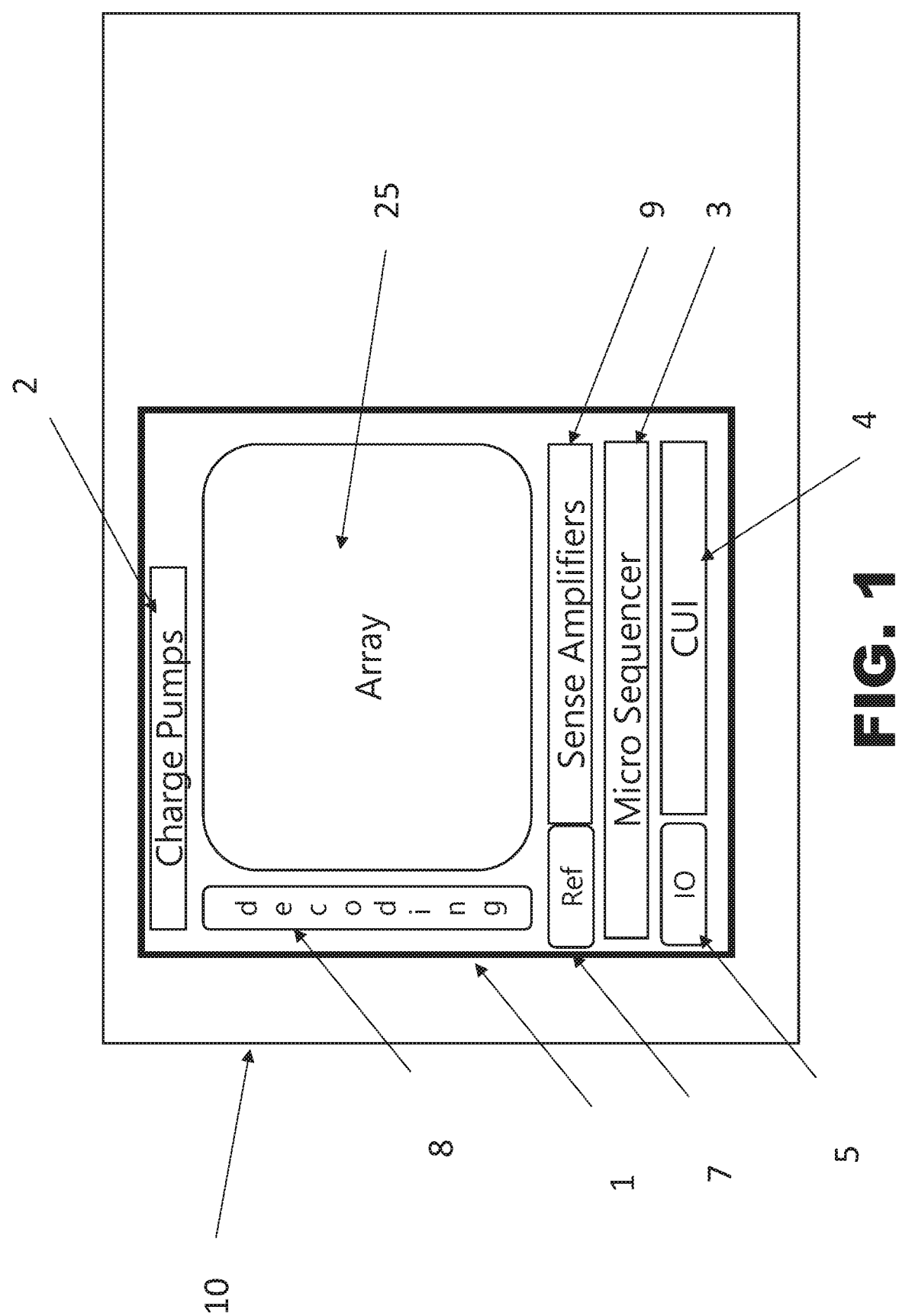
FIG. 1 shows a schematic view of a memory component including a flash memory portion according to one embodiment of the present disclosure.

The embodiments herein and the various features and advantageous details thereof are explained more fully with reference to the non-limiting embodiments that are illustrated in the accompanying drawings and detailed in the following description.

Descriptions of well-known components and processing techniques are omitted so as to not unnecessarily obscure the embodiments herein. The examples used herein are intended merely to facilitate an understanding of ways in which the embodiments herein may be practised and to further enable those of skill in the art to practice the embodiments herein. Accordingly, the examples should not be construed as limiting the scope of the embodiments herein With reference to those figures, apparatuses and methods involving a non-volatile memory device 1 or component and a host device 10 for such a memory device will be disclosed herein.

The host device 10 can be a System-on-Chip with an embedded memory component 1 or a more complex electronic device including a system coupled to a memory device, as will appear from the description of other embodiments of the present disclosure made with reference to other figures.

The present disclosure suggests improving the memory size by providing a structurally independent memory component 1 coupled to the host device 10 or System-on-Chip. The memory component 1 is structured as a stand-alone device realized in a single die with a technology specifically dedicated to the manufacturing of flash memory devices.

This non-volatile memory component 1 includes an array 25 of Flash memory cells and a circuitry located around the memory array and closer to a plurality of peripheral pads, as will be disclosed later. More specifically, the proposed external architecture allows to overpass the limit of the current eFlash (i.e. embedded flash technology) allowing the integration of bigger memory, as it can be 512 Mbit and/or 1 Gbit and/or more depending on the memory technology and technology node.

More particularly, the Flash memory component 1 includes an I/O circuit 5, a micro-sequencer 3 including a control and JTAG logic and sense amplifiers 9.

The Flash memory component 1 further includes a command user interface CUI 4, voltage and current reference generators 7, charge pumps 2 and decoding circuitry 8 located at the array periphery.

As previously reported, the memory portion 1 is an independent structure but it is strictly associated to the SoC structure 10. However, the manner in which the memory portion is coupled to the System-on-Chip is peculiar and will be evident in the following paragraphs.

While being advantageous under many aspects, the System-on-Chips including large memory arrays may suffer for many drawbacks since the memory portion is realized with a process not specifically designed for memories and possible defects of the memory array may compromise the life or the functioning of the whole SoC structure.

On the contrary, to improve the performances of the whole SoC structure the memory portion 1 has been realized as an independent memory device with a technology specifically dedicated to the manufacturing of flash memory devices. The memory component 1 is associated and linked to the SoC structure partially overlapping such a structure while the corresponding semiconductor area of the SoC structure has been used for other logic circuits and for providing support for the overlapping structurally independent memory portion 1.

The free space in terms of semiconductor area that has been obtained at the level of the System-on-Chip has been used for the integration of additional user's function.

The memory component 1 is obtained as an independent structure but it is strictly associated to the host device or to the SoC structure. More particularly, the memory device 1 is associated and linked to the SoC structure partially overlapping such a structure while the corresponding semiconductor area of the SoC structure has been used for other logic circuits and for providing support for the partially overlapping structurally independent memory device 1 for instance through a plurality of pillars, through silicon vias (TSV), or other similar alternative connections such as ball on grid or with a technology similar to Flip-Chip.

The pillars are realized in the semiconductor area previously dedicated to an embedded memory portion at the same level of the System-on-Chip and connected to the flash memory die.

In one embodiment of the present disclosure the disposition of the pads of the memory component 1 has been realized on a surface of the memory component at the periphery of the structurally independent Flash device. More specifically, the plurality of pads has been realized around the array so that when the memory component 1 is reversed and its pads are faced to corresponding pads of the SoC structure 10. The semiconductor area that in known System-on-Chip devices was occupied by an embedded non-volatile memory portion is now dedicated to the housing of the interconnecting pads corresponding to the pads of the memory component 1. A skilled in this art understands that other coupling methods can be adopted for instance pads over logic technology. The pads are built on top of the logic, similarly to the 3DN and implementing the circuit under the array (CUA technology).

Generally speaking, the memory component 1 has a size that is different if compared with the size of the SoC structure 10, such a size can be minor or greater. Referring to the term "partially overlapping" we intend that the memory component 1 covers partially or not completely the area of the SoC structure 10, or viceversa.

The coupling between the SoC structure 10 and the memory component 1 is realized interconnecting the plurality of respective pads or pin terminals that are faced one toward the other in a circuit layout that keeps the alignment of the overlapping pads even if the size of the memory component 1 should be modified.

Therefore, even a memory component 1 of a larger size may be supported and interconnected with the pads of the SoC structure 10 keeping the position and dislocation of the its interconnecting pads.

For completeness sake it should be remarked that the memory component 1 may be coupled to the SoC structure 10 with a Flip Chip technology or other equivalent coupling techniques.

The final configuration will be a face-to-face interconnection SoC/Flash Array with the sense amplifiers connected to the SoC in a Direct Memory Access configuration for user modes with high frequency accesses.

To read the memory cells of the Array 25 it is provided a dedicated circuit portion including an optimized Read Finite State Machine that is used to ensure high read performance, such as: branch prediction, fetch/pre-fetch, interrupt management. The error correction is left to the SoC 10; additional bits are provided to the memory controller to store any possible ECC syndrome associated with the page. The ECC allow the host also to correct the received data. The host is responsible to fix the data in the memory based on the correction made in the received data cells.

All in all, the Flash memory component 1 of the present disclosure comprises: the memory array, a micro sequencer, a control and JTAG logic, sense amplifiers and corresponding latches.

This Flash memory component 1 uses the interconnection pads of the array and logic circuit portion to allow the interconnection with the host or SoC structure 10.

The final configuration will be a face-to-face interconnection SoC/Flash Array, wherein the sense amplifiers 9 of the memory component 1 will be connected to the SoC in a Direct Memory Access configuration for user mode high frequency access.

The Direct Memory Access allows to reduce the final latency that the SoC can experience when reading the data. Moreover, the final latency is also reduced by the block form factor, the sense amplifiers distribution between blocks, the selection of the comparison threshold in the sense amplifiers and the optimized path.

Figure 2:
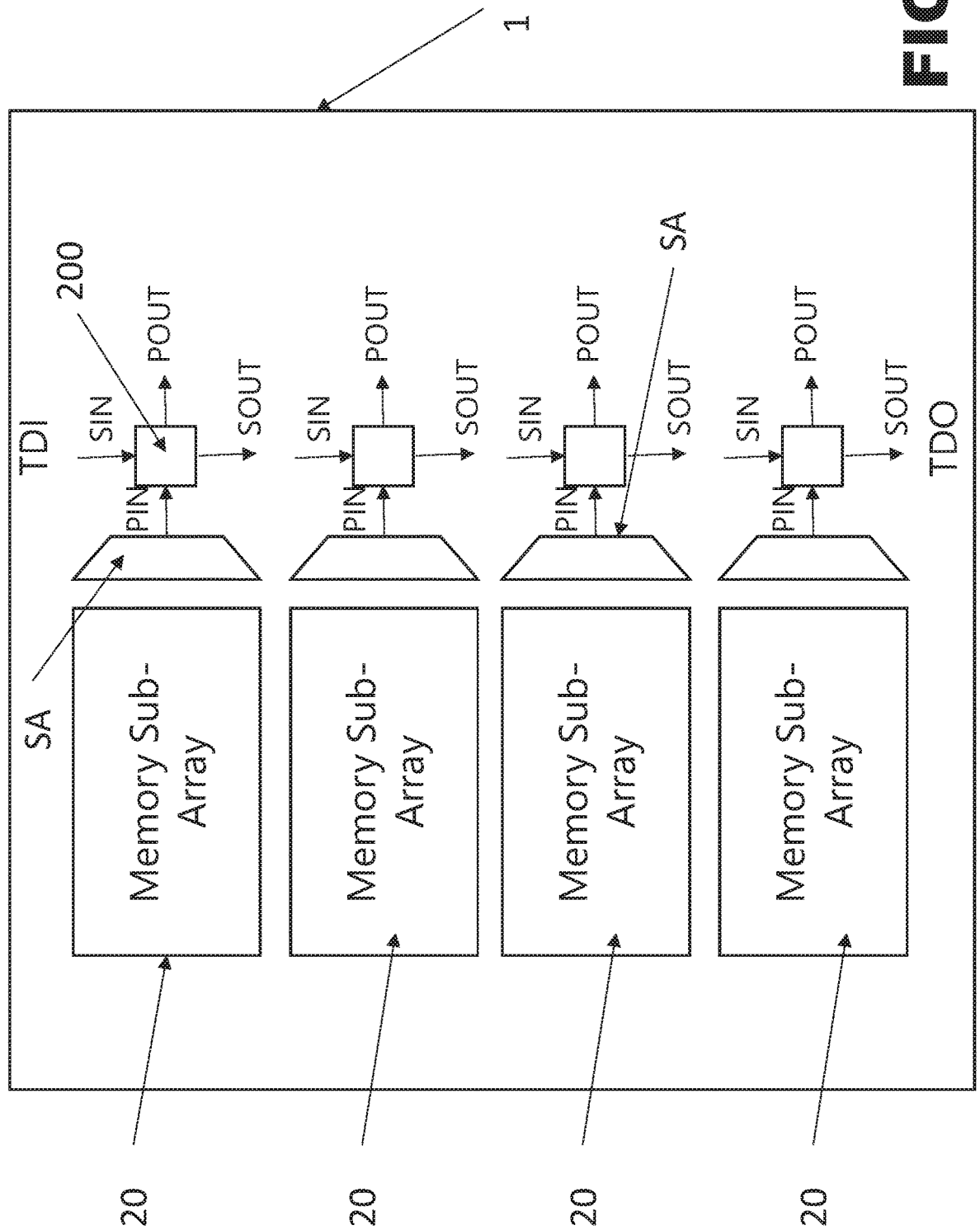
FIG. 2 is a schematic view of the internal layout of a memory portion of FIG. 1 according to one embodiment of the present disclosure.

Making now more specific reference to the example of FIG. 2, in one embodiment of the present disclosure the memory array 25 is built as a collection of sub arrays 20. In this manner, having smaller sectors if compared to known solutions the access time is significantly reduced and the whole throughput of the memory component is improved.

The advantage of this architecture is that it is very scalable and expanding and/or reducing the density of the final device translated only in mirroring a sub-array and generating the connection.

The host device or the System-on-Chip 10 normally includes more than one core and each core is coupled to a corresponding bus or channel for receiving and transferring data to the memory component 1. Each sub-array 20 has access to a corresponding channel to communicate with a corresponding core of the System-on-Chip.

The core of the host device can have access to the JTAG interface by using some internal pads. Such pads are high speed and have the capability to support the maximum frequency. Such pads however cannot manage analog voltage outside the flash array.

In embodiments of the present disclosure a Direct Memory Access (DMA) allows to reduce the final latency that the SoC can experience when reading the data.

To overcome the problems of flash memory devices embedded in System-on-Chips and obtaining a very low initial latency and high throughput, it has been designed a scalable, low-cost, effective and reliable memory apparatus and method involving completion of read operation with data, address and ECC by DMA flash array, ensuring that the data must be read from exactly the same memory location as the controller is asking for.

Figure 3:
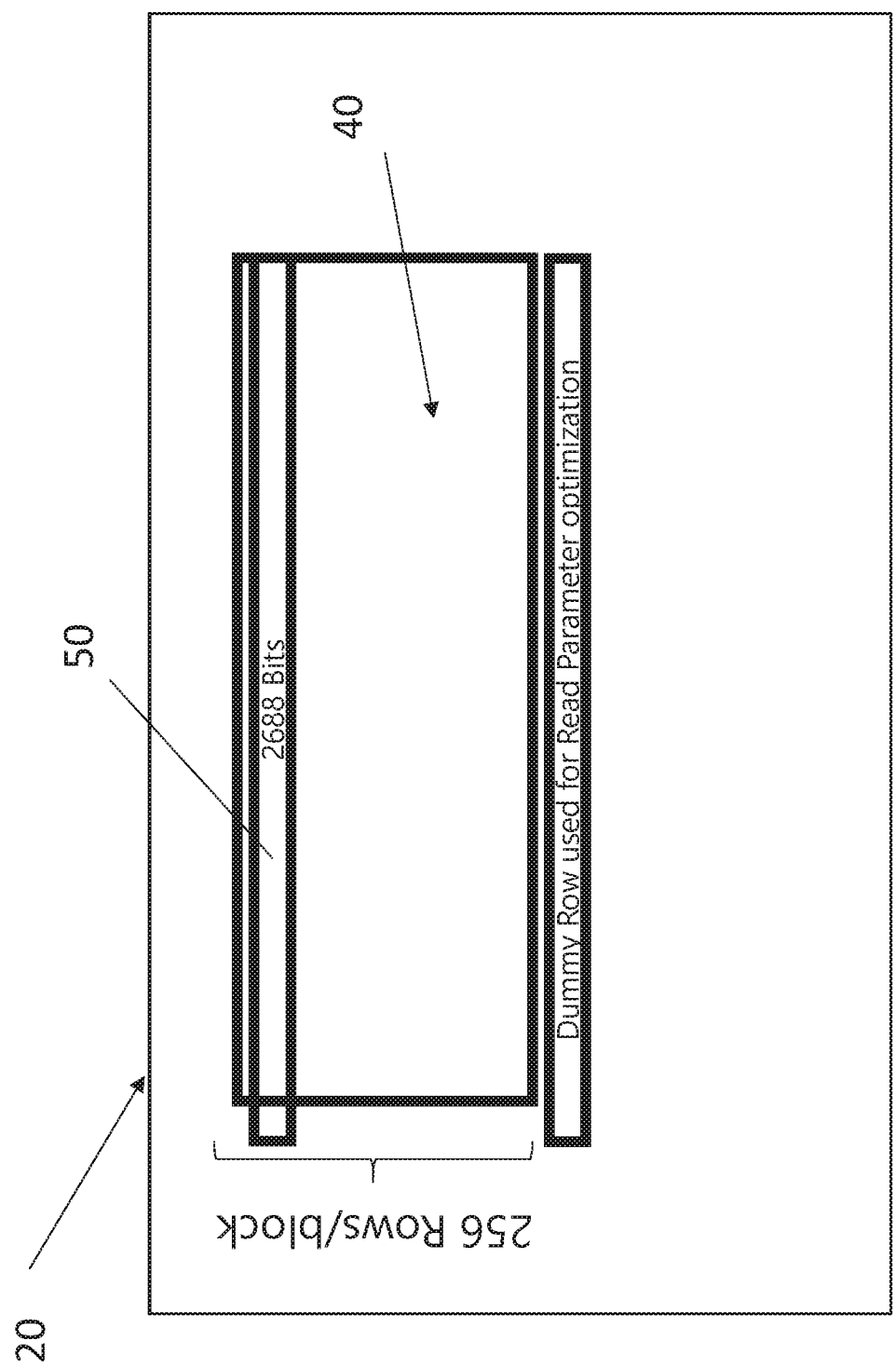
FIG. 3 is a schematic view of a memory block architecture according to one embodiment of the present disclosure.

FIG. 3 is a schematic view of a memory block architecture according to one embodiment of the present disclosure. In one embodiment of the present disclosure each memory sub array 20 is structured in memory blocks 40. The architecture of a memory block 40 comprising each location of the memory array may be defined as super page. A super page is 128 bit I/O needed for the SoC and a 16 bit of ECC involving 24 bit addressing (up to 2G bit of available space).

Said differently, the atomic page of 128 bits used in each sub-array 20 to fill the communication channel with the SoC device has been enlarged in the present implementation to contain the stored address and the ECC. In other words, the Flash memory component is configured to fill a communication channel with an enlarged memory page including data, corresponding address Bits and ECC Bits of each sub-array of the plurality of sub-arrays.

Each memory block contains at least 256 rows and each row includes sixteen super pages of the above size. Each super page includes at least 168 Bits as a combination of data, addressing and ECC Bits. Therefore, each row of the memory array can contain up to sixteen double words of 32 bits each, plus the address and ECC syndrome spare bits per page.

Just to give a numeric value, a super page is formed by 128+16+24=168 Bits and sixteen super pages per each row comprise 168*16=2688 bits.

Therefore, each row 50 of a memory block 40 includes at least sixteen pages comprising a memory word plus the corresponding address Bits and the corresponding ECC Bits. Obviously, another size can be selected and the reported value are just for illustration purpose of a non-limiting example. The outcome of the blocks is driven directly by the host device or SoC 10 without using high power output buffers of the known solutions and optimizing the path thanks a modified and optimized JTAG interface.

The outputs of the sense amplifiers SA per sub array 20 are latched by an internal circuit of a read interface. The memory structure can be expanded to allow multi-page read while shifting out the already read page.

The sense amplifiers SA are connected directly to a modified JTAG cells, that will be later disclosed, so to integrate a JTAG structure and the sense amplifiers in a single circuit portion. This allows reducing as much as possible the delay in propagating the output of the memory array to the SoC.

As previously said, the internal sense amplifiers 9 are preparing two pages of at least 128 bits and while the first page is ready to be shifted, internally it is performed a further read operation of a second page associated with the same address. This allows to prepare from five to eight double word, that are typical in the RTOS application allowing the sense amplifiers to execute a further internal read operation to prepare the second nibble or group of 128 Bits, if the system is structured with two pages of 128 Bits. This is the reason for having chosen a double page of 2×128 bits plus corresponding addresses and ECC Bits. This second part of four double words is transferred to the output of the flash array 25, using an additional enabling signal (i.e. an internal clock signal or an ADV signal) that transfers the content read at sense amplifier level to the host device or SoC device 10. The signal names are load_data [0, 1] . . . there is no need of incrementing the address when using the super page.

The combined string of data cells+address cells+ECC cells allows to implement the whole safety coverage of the communication channel according to the standard requirements of the rule ISO26262, because the ECC covers the whole bus communication (data cells+address cells), while the presence of the address cells provides the confidence that the data is coming exactly from the addressed location of the controller, i.e. if ADD=ADD0.

For a better understanding of the principle of the present disclosure it should be noted that a direct memory access is a feature of computer systems that allows certain hardware subsystems to access main system memory (generally volatile such as random-access memory), independent of the CPU (Central Processing Unit).

More Specifically, DMA is used when the CPU is using memory and it is typically occupied for some clock cycle of the read or write operation. Thus, whenever the I/O devices access the memory it takes a lot of time to get the data in and/or out of the memory.

The I/O devices first initiates the transfer using DMA Controller, relinquishing the control of buses from the CPU, and then CPU does other operations while the transfer is in progress, and it finally receives an interrupt from the DMA controller when the operation is done, hence address or data buses can now be used by it for its internal operations. This feature is useful at any time that the CPU cannot keep up with the rate of data transfer, or when the CPU needs to perform work while waiting for a relatively slow I/O (Input or Output) data transfer. Many hardware systems use DMA, including disk drive controllers, graphics cards, network cards and sound cards.

DMA is used according to the present disclosure for intra-chip data transfer in multi-core processors. The cores that have DMA channels can transfer data to and from the memory components with much less CPU overhead than cores without DMA channels. Similarly, a processing element inside a multi-core processor can transfer data to and from its local memory without occupying its processor time, allowing computation and data transfer to proceed in parallel.

The direct memory access of the present disclosure employs boundary scan cells and sense amplifiers as a system and method for addressing direct memory access operation and locating the memory address to a specific DMA flash array. In this respect, a modified JTAG cell structure is implemented to allow enlarging the memory pages to be read in a direct access.

FIG. 2 is a schematic view of the internal layout of a memory portion of FIG. 1 according to one embodiment of the present disclosure. As shown in the example of FIG. 2, a boundary scan cell 200 associated to a sense amplifier comprises of two inputs and two outputs. The two inputs are SIN (Serial Input) and PIN (Parallel Input) and the two outputs are SOUT (Serial Output) and POUT (Parallel Output). The boundary scan cell 200 is associated as output of the sense amplifiers SA.

DMA can be implemented connecting directly the sense amplifier with the controller. However, the major drawback associated with these DMA technologies for accessing DMA memory and locating the memory address to a specific and/or all of the DMA flash array is that the data buffers in the DMA flash array performing read operation are not completed with data, address and ECC (Error correction codes) which can lead to mismatch in data.

The present invention overcomes and addresses the above problems by disclosing direct memory access technologies that employ a method using a system of modified boundary scan cells and sense amplifiers for addressing direct memory access operation and locating the memory address to a specific DMA flash array.

One embodiment of the present disclosure relates to a memory component having a structurally independent structure and coupled to a System-on-Chip through a plurality of interconnection pads, comprising:
 a memory array including a plurality of independently addressable sub arrays;
 sense amplifiers coupled to corresponding outputs of said sub arrays and coupled to a communication channel of said System-on-Chip;
 a scan-chain comprising modified JTAG cells coupled in parallel between the output of the sense amplifiers and said communication channel to allow performing read operations in a Direct Memory Access.

Figure 5:
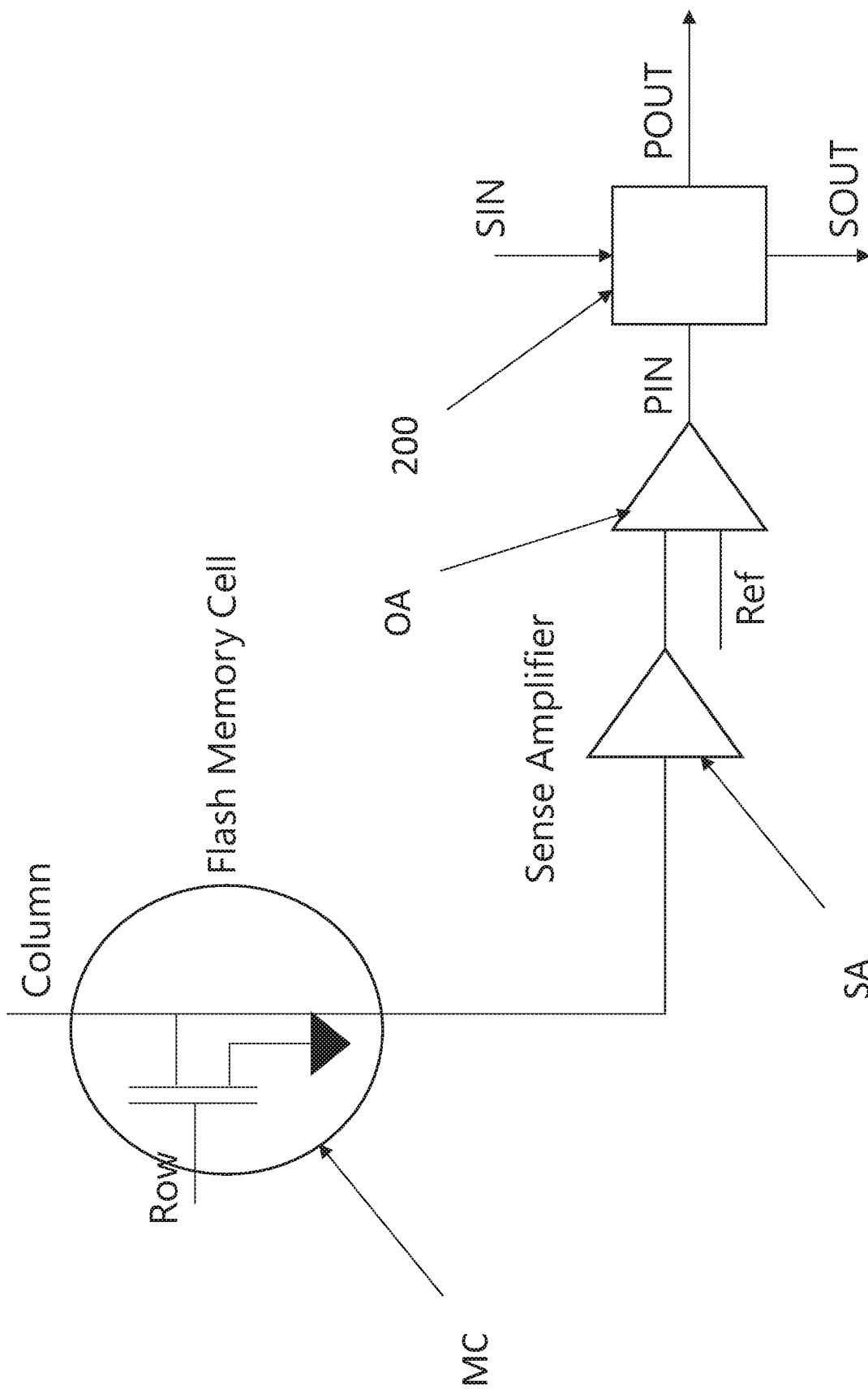
FIG. 5 is a schematic view of the connections between a generic memory cell and a corresponding sense amplifier with the inclusion of a modified JTAG cell according to the present disclosure.

For instance, the schematic example of FIG. 5 shows a generic memory cell MC which is located at the intersection of a row of memory cells and a column of memory cells in an array of cells of a generic sub-array 20, so that the cell MC can be addressed accordingly.

Figure 4:
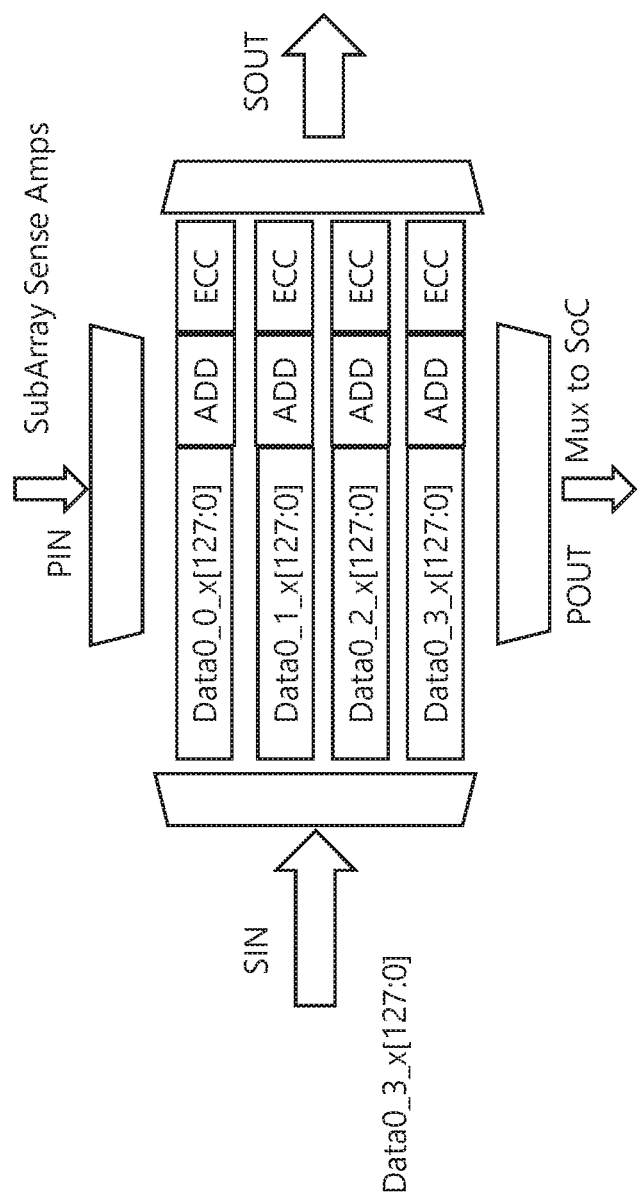
FIG. 4 shows a schematic view of the content of a data buffer for the memory block architecture of the present disclosure.

A sense amplifier SA is coupled to the column of memory cells as part of the read circuitry that is used when a data is read from the memory array. Other conventional components or circuitry inserted between the cell and to the output of the sense amplifier SA have been omitted. Generally speaking, a page including a word of 128 Bits plus address Bits plus ECC bits (i.e. at least 168 Bits) is read at a time in the present implementation, even if each row of the memory sub-array is wider as previously reported. More precisely, according to one embodiment of the present disclosure, a data buffer includes not only data, but also corresponding address bits and ECC bits, as depicted in FIG. 4, that shows a schematic view of the content of a data buffer for the memory block architecture of the present disclosure.

As is well known, the role of the sense amplifier SA is that of sensing the low power signals from the array row. The low voltage values representing the logic data Bit (1 or 0, depending on the convention used) stored in the memory cell MC are amplified to a recognizable logic level so the data can be properly interpreted by logic circuit portions outside the memory.

In the example disclosed herewith the output of each sense amplifier SA is coupled to the modified JTAG cell 200 so to integrate a JTAG structure and the sense amplifier.

In the non-limiting example disclosed herewith an output amplifier OA is interposed between the sense amplifier SA and the JTAG cell 200.

In one embodiment of the present disclosure all the JTAG cells 200 coupled to the sense amplifiers of a memory sub-array are to be considered a data buffer including a data page, including in this example at least one-hundred-and-twenty-eight (128) Bits, and corresponding address Bits and ECC Bits (as also depicted in FIG. 4, that shows a schematic view of the content of a data buffer for the memory block architecture of the present disclosure, in some embodiments) for the reading of a combined memory page at a time from the four sub arrays 20.

However, as previously reported, the communication channel between the memory component and the SoC structure may two combined memory words and the JTAG cell 200 has been modified just to duplicate the internal latches to be able to shift the first or higher portion of the 168 Bits of the data+address+ECC to be read with the second or lower portion of the data to be read. Obviously, in this contest "higher" means the data portion that is loaded before while "lower" means the data portion that is loaded after.

A skilled in this art will understand that the number of internal latches of the modified JTAG cell can be augmented in case of need to improve the number of Bits to be transferred to the SoC structure through the communication channel. For example, the above structure may be expanded according to the page size required by the particular implementation of the controller of the memory device.

The boundary scan cells are modified JTAG cell. Therefore, a modified memory array implementation is disclosed with each data buffer containing 128 modified JTAG (Joint Test Action Group) cells and the common data load signals generated to capture the whole 168×2 Bits.

The signal generation is performed internally by a memory controller when the read operation is made in the specific data buffer, while there are SoC (System on chip) controllers to allow the read mechanism, using the 128 parallelism. The main advantage of having these data buffers is that each data buffer can make free the sense amplifier to read in another memory location.

Figure 6:
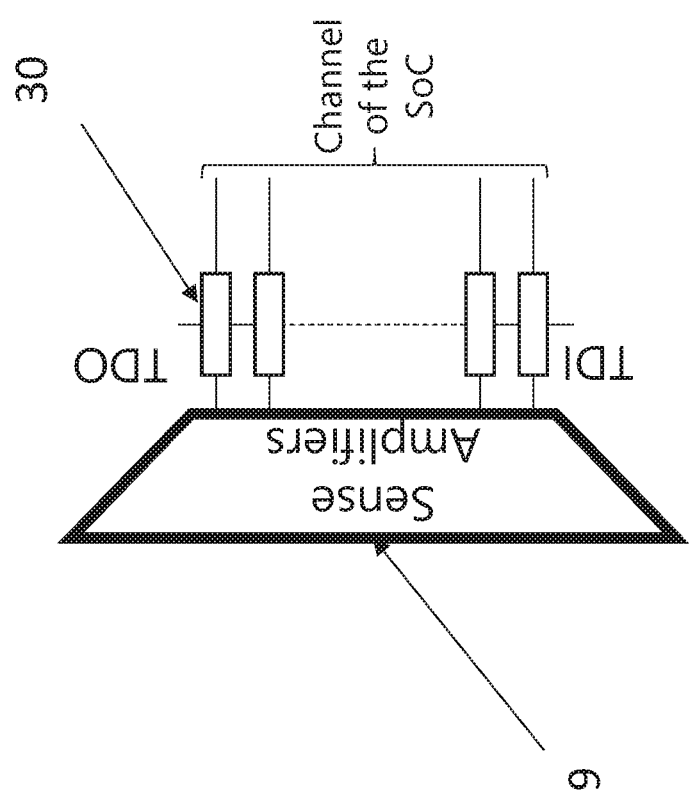
FIG. 6 is a schematic view of a boundary scan basic cell sub-array architecture according to one embodiment of the present disclosure.

As we have seen, the memory array 25 is built as a collection of sub array 20 including independently addressable memory units and each sub array is coupled to a channel of the SoC, as shown in FIG. 6.

The sub array sense amplifiers 9 are connected with a scan chain 30 connecting together the output of the sub-array 20. Each sub array scan chain 30 can be connected to form a unique chain with the other sub-array and or can be treated as a separate scan chain register. The usage of this boundary scan cell interconnection structure is important because it allows boundary scan as method to check the interconnection between the SoC and the DMA Flash Array and also allows implementing the Direct Memory Access connecting directly the sense amplifier 9 with the core of the SoC.

Moreover, thanks to their internal structure the boundary scan cells 200 allow leaving the sense amplifier SA to prepare the second 168×2 Bits wide page with the ECC and the address written close to the page. The JTAG (Joint Test Action Group) cell is connected in such a way that PIN is the output of a sense amplifier, POUT is the output of the cell to the communication channel with the SoC, SIN is the serial input connected to the serial output of the previous amplifier SA and SOUT is the serial output connected to the SIN of the next sense amplifier SA. While the first 168 bits are ready to be outputted toward the SoC correspondent data input or output, the internal sense amplifier can trigger the read of the other section of the 168 bits.

Scan chains comprising boundary scan cells 200 can be connected together to form a unique shift register 30 to proper test the interconnections. The test data input (TDI) and test data outputs (TDO) are the pins used for testing purposes using the boundary scan cells 200. The input signal is given at TDI pin and the data is checked at the TDO pin for its validity. The advantage of this architecture is that it is very scalable and helps in expanding and/or reducing the density of the final device translates only in mirroring a sub-array and generating the interconnections.

The Direct Memory Access allows reducing the final latency that the SoC can experience when reading the data. The output of the sense amplifier must be first latched by an internal circuit, so as to allow the sense amplifier to execute an internal further read operation to prepare the second nibble of 128 bits. This second nibble is transferred to the output of the flash array, using an additional signal that transfers the content read at sense amplifier level to the SoC.

In embodiments of the present disclosure reference is made to a JTAG (Joint Test Action Group) boundary scan cell 200 that allows implementing the Direct Memory Access connecting directly the sense amplifier with the controller and leaves the sense amplifier free to prepare the second group of Bits to form a 168×2 Bits wide page with the ECC and the address written close to the page.

Figure 7:
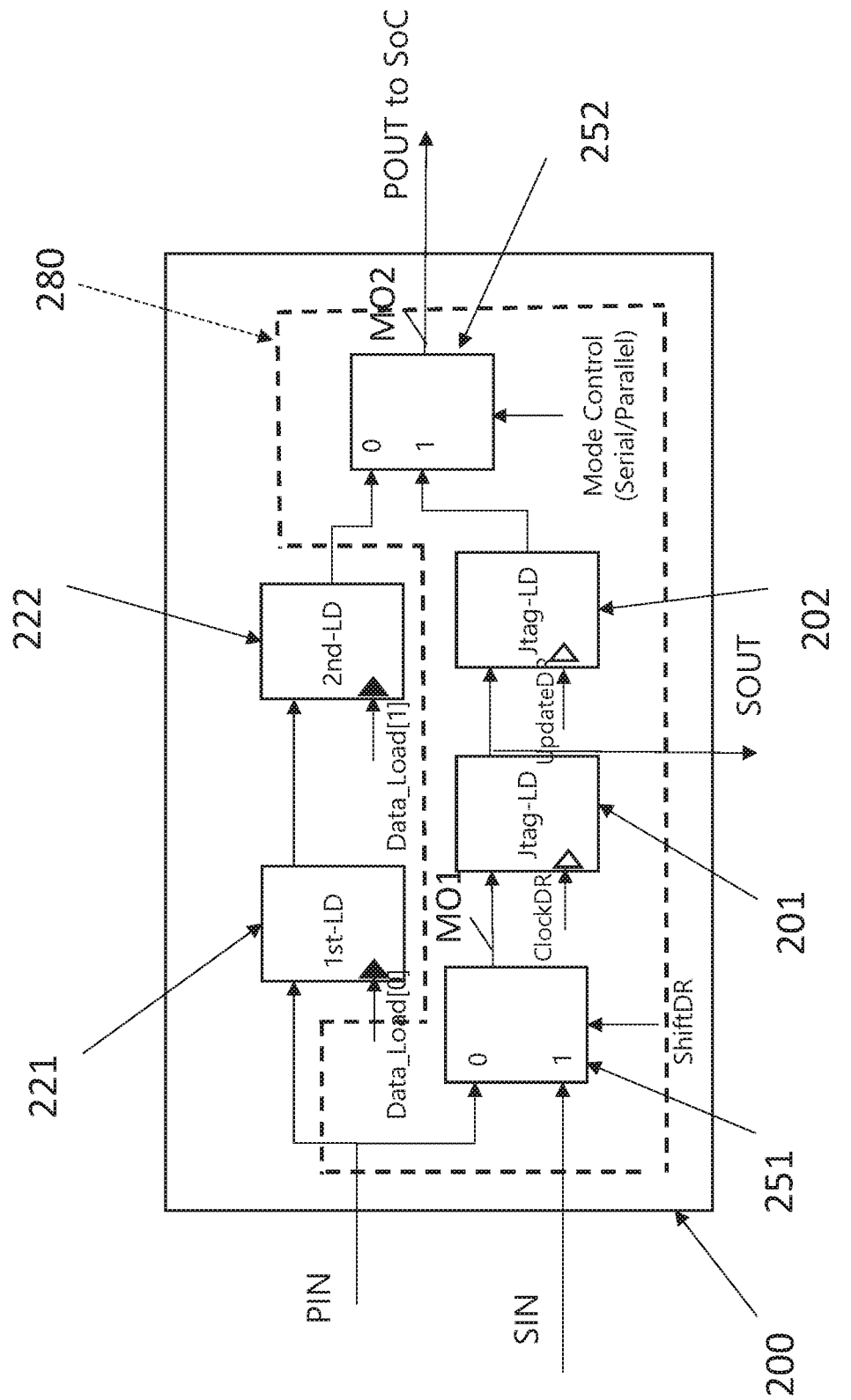
FIG. 7 is a schematic view of a data buffer containing modified JTAG (Joint Test Action Group) cells according to the present disclosure.

FIG. 7 shows a more detailed schematic view of the internal structure of such a modified JTAG cell 200 of the memory architecture of the present disclosure. The modified JTAG cell of FIG. 7 is just an implementation example since it would be easy to increase the number of Flip-flop in the JTAG cell thus enlarging the fetch/pre-fetch scheme and the way the cell operates.

Each data buffer associated to a sense amplifier includes at least 168 modified JTAG cells and the common data load signals generated to capture the whole 168×2 bits. The signal generation is performed internally by a controller when the read operation is made in the specific data buffer, while there are SoC cores to allow the read mechanism, using the 128 parallelism.

Just as an example, the output of the sense amplifier must be latched by an internal circuit, so as to allow the sense amplifier to execute an internal further read operation to prepare the second nibble of 168 bits. This second nibble is transferred to the output of the flash array, using an additional signal that transfers the content read at sense amplifier level to the SoC.

Two multiplexers are provided in which one multiplexer provides serial input to JTAG cell at a specific clock timing which in turn processes first bit and updates it to the second JTAG cell at a specific clock timing. After updating the output is passed as an input to second multiplexer which in turn decides that the data output will be from serial or parallel channel with the help of mode control signal and in this manner 128 JTAG cells in a data buffer can process a total of 168×2 bits as an output to SOC.

Thanks to the serial input and output a testing process may be performed to check that no fault connection is present between the memory portion 1 and the associated System-on-chip. Thanks to the parallel input and output the same JTAG cell is used as data buffer for the completing the reading phase through the sense amplifiers.

The modified JTAG cell 200 comprises a boundary scan basic cell 280 including a couple of latches 201 and 202 and a couple of multiplexer 251 and 252. A first input multiplexer 251 and a second output multiplexer 252.

The boundary scan basic cell 280 is indicated by the dotted line box in FIG. 7 and is a two inputs cell, with a serial input corresponding to SIN and parallel input corresponding to PIN, and two outputs cell with a serial output corresponding to SOUT and a parallel output corresponding to POUT.

The first multiplexer 251 receives on a first input "0" a parallel input signal Pin from the first parallel input terminal PIN and on a second input "1" a serial input signal Sin from the first serial input terminal SIN.

This first multiplexer 251 is driven by a control signal ShiftDR of the FSM of a JTAG interface and has an output MO1. The cell 280 has at least two multiplexed outputs for instance MO1 and MO2. A JTAG clock signal ClockDR drives the output from the serial output SOUT The operations of a Finite State Machine based on the JTAG protocol providing signals like the clock signal and the above indicated ShiftDR are not disclosed in this specification just to simplify the whole description.

The first output MO1 is connected to a first input of the first latch 201 that receives on a second input terminal the clock signal ClockDR.

The first latch 201 is connected in chain to the second latch 202 with a first output of the first latch 201 connected to a first input of the second latch 202.

It is important to note that the output of the first latch 201 is also the serial output SOUT of the whole JTAG cell 200.

A second input terminal of the second latch 202 received a signal UpdateDR.

The second latch 202 has an output connected to an input of the second multiplexer 252, in particular to its second input.

This second multiplexer 252 is controlled by a Mode Control signal that allows to switch the whole JTAG cell 200 from a serial to a parallel mode and viceversa.

In one embodiment of the present disclosure the JTAG cell 200 further includes another couple of latches 221 and 222 provided between the parallel input Pin and the second multiplexer 252. These further latches 221 and 222 are the latching of the direct read, i.e. first 128 Bits, and the shadow one, i.e. second part of the 168×2 Bits. In other words, the JTAG cell 200 includes the boundary scan cell 280 and at least the further latches 221 and 222 providing a modified JTAG cell 200.

We will refer hereinafter to these further latches as a third latch 221 and a fourth latch 222. In other embodiments a longer chain of latches may be used. These latches are used in the fast path to be sure that the data from the SA is latched and available to the controller while the SA are reading again inside the sub-array.

More particularly, the third latch 221 and the fourth latch 222 are connected in a small pipeline configuration with the third latch 221 receiving on a first input the parallel input signal Pin from the first parallel input terminal PIN and receiving on a second input a signal Data_Load[0] corresponding to a first data load. Thus, increasing the page depth corresponds to have more signals Data_Load[x].

The fourth latch 222 receives on a first input the output of the third latch 221 and receives on a second input a signal Data_Load[1] corresponding to a subsequent data load.

The output of the fourth latch 222 is connected to the first input "0" of the second multiplexer 252 that produces on its output terminal MO2 the output signal for the parallel output terminal POUT.

If compared to a conventional JTAG cell the JTAG cell 200 of the present disclosure may be considered a modified JTAG cell because of the presence of the two extra latches, the third and fourth latches 221 and 222, beside the presence of the boundary scan cell 280.

The scan chain made by the interconnected modified JTAG cells 200, using the serial input and output involves a couple of advantages such as allowing to test the successful interconnection between the SoC and the DMA memory, further implementing digital test of the sense amplifiers as the cell can work as program load to store the data inside the matrix and ability to work as second level of latches.

Just to explain the manner in which data are transferred in the data buffer we have to imagine that when a data is loaded in the one of the two latches 221 or 222, the other latch is in a stand-by state but ready to receive the subsequent data portion.

Therefore, the first section including 168 Bit is transferred to the SoC structure for a first data elaboration while the reading phase is not stopped since the other portion of 168 Bits are prepared to be loaded into the latches at the subsequent clock signal.

Each data buffers contains 168 modified JTAG cells 200 and the common Data_Load[1:0] are signals generated to allow to capture the whole 168×2 Bits, that is to say: eight double words DWs according to the proposed implementation.

The signal generation is internally controlled when the read operation is performed in a specific data buffer and the signals are controlled by the SoC structure to allow performing read phase using a 128 Bits parallelism.

The main benefit of this memory architecture is that each buffer can contain the whole double words DWs thus leaving free the sense amplifier to read in another memory location.

The low latency of the memory component of the present disclosure is due to the proper size of the sub-array blocks and to the optimization in the data path, i.e. the internal gates that are connecting the array to the output pads.

Making reference to FIG. 8, it is now disclosed a sub-array addressing scheme which involve a set of instructions implemented in two ways which are: global address loading and local address loading.

The need of having a very low initial latency and high throughput is driving the generation of the following scheme for the addressing per sub-array. FIG. 8 shows row address buffers and the corresponding row data buffers in the structure similar to DRAM but here we have adopted the super pages addresses and corresponding data, i.e. 168×2.

The implemented set of instructions to address the memory array implemented can be of two types or two levels of address; in other words: a global instruction selects the sub array while a local instruction selects one of the address register (for instance one of the four) associated with the selected subarray.

Global address loading: in this case all the sub array will receive the address in multiple steps using a command, i.e. load_global_address_0, load_global_address_1, etc.

Local address loading: in this case only the addressed register in the selected sub-array will receive the new address, i.e. local_address_0_0, local_address_0_1, local_global_address_1_3, etc.

Each sub-array will contain a set of 4× data registers, for instance 4×(data+address+ECC cells) corresponding each to an address register. 4× data registers are containing a super page, that is to say: data_H+data_L (having removed the link to the specific address).

The address registers are connected to the address decoder when the read or modify operation are addressing the array. The link is driven by the flash controller in the modify phase while the read finite state machine is linking them when the read is triggered. The address register is loaded using a JTAG finite state machine. when the corresponding instruction, Load_Address is recognized and the Shift_DR state is in the JTAG tap then the TDI is connected to the address register.

A Global_Address_Loadx command is used to load at the same time the nibble of eight bits in the corresponding registers:

Global_Address_Load0 in the instruction register generates the load of the addr0_0. This command, for example, can address the sub array 0; similarly, it happens for the selection of the corresponding sub array address registers, addr1_0, addr2_0 and addr3_0 using three TCK cycles when the finite state machine of the JTAG interface is in the Shift_DR state.

Local_Address_Load0_0 in the instruction register generates the load of the addr0_0, using three TCK cycles when the finite state machine is in the Shift_DR state. This command, as example, addresses the register 0 of the selected subarray. This means that when the ShiftDR is reached the TDI is connected to the input of this shift register and the TDO to the output, if the flexible TDI is used we need only three clock periods Tck to have the whole address inside the selected address register, otherwise we would need 24 clock periods Tck.

These instructions (Global_Address_Load0, Global_Address_Load1, Global_Address_Load2, Global_Address_Load3) allow the pre-load of the address for all the channels implemented in the flash array. Those four instructions are implemented to select one of the four sub array. In a possible implementation with eight cores, we will need eight commands, one for each core or a method to select one of the cores using one command and a sub array address. Therefore, the introduction of the above command permits to optimize the communication between the SoC structure 10 and the memory component 1 enhancing the transfer performance to the controller The instructions (Local_Address_Load0_0, . . . , Local_Address3_3) allow the use of a single core/channel avoiding the need for the controller to manage the whole set of cores when only one is working; the cores are independent and they can use their own channel when it is needed. This instructions serves for selecting one of the address register of the selected subarray.

The implementation of this last disclosed mechanisms ensures the optimization of the read operation of the memory.

A method for retrieving data from a memory component coupled to a host device or a System-on-Chip and including at least an array of memory cells with associated decoding and sensing circuitry is also disclosed. The method may be carried out in a SoC comprising a structurally independent memory component according too the description with reference to FIGS. 1-8 above, for example.

The method may comprise a step of structuring the memory array into a plurality of independently addressable sub arrays. The independent addressable sub arrays may be sub arrays 20 depicted in FIG. 4, in some embodiments.

The method may comprise a step of providing sense amplifiers coupled to corresponding outputs of said sub arrays and coupled to a communication channel of said System-on-Chip. Sense amplifiers, for example SA in FIGS. 2 and/or 4, may be coupled to a communication channel between structurally independent non-volatile component 1 and a host or a system-on-chip (SoC) 10, as depicted in FIG. 1, for example.

The method may comprise a step of providing a scan-chain formed by modified JTAG cells coupled in parallel between the output of the sense amplifiers and said communication channel to perform read operations in a Direct Memory Access. The scan chain and modified JTAG cells may be those depicted in FIGS. 2 and 4-8 in some examples. In some cases, said modified JTAG cells include boundary-scan cells including at least a couple of further latches between a parallel input and parallel output.

Additionally, the method may comprise a step of multi-page reading wherein the multi-page reading; such step may comprise latching Bits of a first memory page, presenting the Bits of the first memory page at the output of sensing circuit after latching and executing a further reading operation to prepare Bits of at least a second memory page at least partially while latching and/or presenting the Bits of the first memory page.

In several of the embodiments described above, the method may comprise providing data cells and corresponding address and ECC cells Bits. For example an extended page, as described with reference to FIGS. 3 and 4 above, may include data cells and corresponding address and ECC cells for improved security. Additional or fewer steps may be carried out when executing the method and the order in which the steps are carried out may be changes, in some embodiments.

From the foregoing, it will be appreciated that specific embodiments of the invention have been described herein for purposes of illustration, but that various modifications may be made without deviating from the scope of the invention. Accordingly, the invention is not limited except as by the appended claims.

It is to be understood, however, that even though numerous characteristics and advantages of the present invention have been set forth in the foregoing description, together with details of the structure and function of the invention, the disclosure is illustrative only. Changes may be made in the details, especially in matters of shape, size, and arrangement of parts within the principles of the invention to the full extent indicated by the broad general meaning of the terms in which the appended claims are expressed.

The invention claimed is:

1. A memory device, couplable to a host device or a system-on-chip (SoC), comprising:
   an array of memory cells with associated decoding and sensing circuitry, wherein a plurality of sub arrays of the array of memory cells is independently addressable inside the memory device;
   sense amplifiers coupled to corresponding outputs of the plurality of sub-arrays and coupled to a communication channel of the host device or the SoC; and
   a scan chain including modified Joint Test Action Group (JTAG) cells coupled in parallel between an output of the sense amplifiers and the communication channel, wherein the memory device is configured to fill the communication channel with an enlarged memory page including data, corresponding address bits, and ECC bits of each sub array of the plurality of sub arrays.

2. The memory device of claim 1, wherein the modified JTAG cells include boundary-scan cells including a plurality of latches between a parallel input and parallel output.

3. The memory device of claim 2, wherein the boundary scan cells include an input multiplexer and an output multiplexer and wherein the plurality of latches is coupled between the input multiplexer and the output multiplexer.

4. The memory device of claim 2, wherein the plurality of latches is connected in a pipeline between a parallel input and a parallel output of each cell.

5. The memory device of claim 1, wherein the modified JTAG cells are serially connected in the scan chain.

6. The memory device of claim 1, wherein each sub array of the plurality of sub arrays is structured in memory blocks including each at least 256 rows and each row includes at least sixteen pages comprising a memory word, corresponding address bits, and corresponding ECC bits.

7. The memory device of claim 1, wherein the output of sense amplifiers is configured to combine data cells, address cells, and ECC cells.

8. The memory device of claim 1, wherein the size of a memory page of each sub array includes at least 168 Bits.

9. The memory device of claim 1, wherein the memory device is a flash memory device structurally independent from the host device or the SoC, wherein the memory device is couplable to the host device or the SoC through a plurality of interconnection pads, and wherein the communication channel is configured to perform read operation in a direct memory access.

10. The memory device of claim 9, wherein the Direct Memory Access includes the modified JTAG cells and the sense amplifiers for addressing, directly, a location of the array of memory cells of the flash memory device.

11. The memory device of claim 9, wherein the flash memory device is configured to apply the direct memory access for intra-chip data transfer in multi-core communication between the flash memory device and the host device or the SoC.

12. An apparatus, comprising:
   a system-on-chip (SoC) device;
   a non-volatile memory device having a structurally independent structure from the SoC device;
   an interconnection pin of the non-volatile memory device coupled to an interconnection pin of the SoC device;
   a memory array in the memory device including a plurality of independently addressable sub arrays;
   sense amplifiers coupled to corresponding outputs of the sub arrays and coupled to a communication channel of the SoC device; and
   a scan chain comprising modified Joint Test Action Group (JTAG) cells coupled in parallel between an output of the sense amplifiers and the communication channel to perform read operations in a direct memory access, wherein the apparatus is configured to fill the communication channel with an enlarged memory page including data, corresponding address bits, and ECC bits of each sub array of the plurality of sub arrays.

13. The apparatus of claim 12, wherein a sense amplifier of the sense amplifiers is configured to output data cells, address cells, and ECC cells.

14. The apparatus of claim 12, wherein the modified JTAG cells include boundary-scan cells including a plurality of latches between a parallel input and parallel output.

15. The apparatus of claim 12, wherein the modified JTAG cells are serially connected in the scan chain.

16. An integrated circuit, comprising:
   an array of memory cells including a plurality of independently addressable sub arrays;
   sense amplifiers coupled to corresponding outputs of the sub arrays and coupled to a communication channel of a system-on-chip (SoC); and
   a scan chain formed by modified Joint Test Action Group (JTAG) cells coupled in parallel between an output of the sense amplifiers and the communication channel to perform read operations in a direct memory access, wherein the integrated circuit is configured to fill the communication channel with an enlarged memory page including data, corresponding address bits, and ECC bits of each sub array of the plurality of sub arrays.

17. The integrated circuit of claim 16, wherein said modified JTAG cells include boundary-scan cells including latches between a parallel input and parallel output.

18. The integrated circuit of claim 16, wherein the array of memory cells comprises data cells and corresponding address and ECC cells.

\* \* \* \* \*